United States Patent [19]

Bindell et al.

[11] 4,107,835
[45] Aug. 22, 1978

[54] FABRICATION OF SEMICONDUCTIVE DEVICES

[75] Inventors: Jeffrey Bruce Bindell; Edward Franklin Labuda; William Michael Moller, all of Allentown, Pa.

[73] Assignee: Bell Telephone Laboratories, Incorporated, Murray Hill, N.J.

[21] Appl. No.: 767,681

[22] Filed: Feb. 11, 1977

[51] Int. Cl.² .................................. B01J 17/00
[52] U.S. Cl. ............................ 29/590; 357/15; 427/84
[58] Field of Search ............ 29/590, 591; 427/84; 357/15

[56] References Cited

U.S. PATENT DOCUMENTS

| | | | |
|---|---|---|---|
| 3,918,149 | 11/1975 | Roberts | 29/591 X |
| 3,935,635 | 2/1976 | Botzenhardt | 29/591 X |
| 3,938,243 | 2/1976 | Rosvold | 357/15 X |
| 3,968,272 | 7/1976 | Anand | 427/84 |
| 3,995,301 | 11/1976 | Magdo | 357/15 |

Primary Examiner—Howard N. Goldberg
Attorney, Agent, or Firm—Arthur J. Torsiglieri

[57] ABSTRACT

An improved Schottky barrier connection is made to a desired region of a silicon wafer by implanting the region with ions to peak at a particular depth; depositing a suitable contact material, such as platinum, over such region; and then heating the wafer to react the platinum and the silicon such that the interface between the platinum-silicide and the silicon penetrates beyond the peak depth of the implant, some of the encountered dopant ions being accumulated at the advancing interface in snowplow fashion. There results a narrowed and concentrated layer of implanted ions localized just below the interface of the silicide and the silicon. The presence of this layer permits conduction in the forward direction at lower applied voltages without substantially degrading the reverse blocking characteristics.

9 Claims, 6 Drawing Figures

FABRICATION OF SEMICONDUCTIVE DEVICES

BACKGROUND OF THE INVENTION

This invention relates to semiconductive devices. It is of primary application to the fabrication of such devices which involve a surface barrier (Schottky) connection.

Modern semiconductor technology has been making increasing use of Schottky connections both in discrete devices such as Schottky diodes and in integrated circuit forms such as Schottky TTL logic.

One of the attractions of Schottky connections is that it permits a rectifying barrier which has a lower threshold voltage for significant conduction in the forward direction as compared to p-n rectifying junctions. Such low threshold devices are becoming of increasing interest, particularly in microelectronics where operation is advantageously at low voltage signal levels. The threshold voltage associated with a surface barrier connection is dependent both on the metal used in making the connection and the nature of the underlying semiconductor where the connection is made.

While one expedient for getting a low barrier connection is choice of an appropriate contact metal, this is not always an adequate solution, particularly when the choice of contact metal is dictated by other considerations, such as the case when the same metal is to be used to make a number of separate connections of different properties.

It has been suggested hitherto that the effective height of a surface barrier connection for a given metal and correspondingly the threshold voltage can be reduced by a shallow implant of appropriate dopant ions in the region of the semiconductor underlying where the surface barrier connection is to be made. In particular, the implantation is used to create there a localized layer of higher doping than the substrate to lower the effective barrier height. Moreover, essentially all of the implanted ions are sought to be localized in a shallow surface layer to be encompassed within the depletion layer associated with the contact metal at zero applied bias. It is important to maintain the bulk of the substrate at lower doping in order to keep the reverse leakage low. For a discussion of this technique, see U.S. Pat. No. 3,943,552 which issued to J. M. Shannon et al on Mar. 9, 1976. This technique is also discussed in a paper by J. M. Shannon entitled "Reducing the Effective Height of a Schottky Barrier Using Low-Energy Ion Implantation" in *Applied Physics Letters*, Vol. 24, No. 8, Apr. 15, 1974. In practice, we have found it extremely difficult by prior art techniques, to achieve the desired reduction in threshold voltage in metal-silicide devices without also increasing undesirably the high reverse leakage associated with such a connection. One problem appears to be difficulty in actually limiting most of the implanted ions to the desired shallow layer. In particular, it is relatively difficult to get an ion beam to produce the required narrow impurity distribution immediately below the platinum silicide-silicon interface. In addition, very shallow implants are particularly sensitive to the nature of the surface.

SUMMARY OF THE INVENTION

An object of the present invention is an improved process for making low threshold voltage surface barrier connections.

To this end we have discovered a technique which permits narrowing the impurity profile normally associated with an ion implant and localizing its peak closer to the effective surface. In this broader aspect the invention is not necessarily limited to the fabrication of Schottky barrier connections.

In particular, in accordance with an illustrative embodiment of our invention, use is made of a snowplow effect by which an advancing silicide phase pushes encountered foreign ions deeper into the semiconductor, whereby a final structure can result in which most of the implanted ions are located in a narrow region closely underlying the silicide-silicon interface.

In one exemplary embodiment of the invention, the silicon semiconductor device which is to include a surface barrier connection is prepared in the usual fashion up to the point in the process prior to formation of the surface barrier connection. Since in this example, the surface barrier connection is to be made to an N-type zone, donor ions are implanted to a depth consistent with the further processing to be described below. After thermally activating the implanted ions in the usual fashion, the surface is cleaned by removal of a small amount of silicon. There is then deposited the desired contact metal to a thickness sufficient that when the subsequent reaction with the silicon is complete the resulting metal silicide-silicon interface is located well beyond the original peak of the implant. The device is then heated for a time sufficient for this phenomenon to occur, with the subsequent accumulation of many of the implanted ions in a narrow layer which is contiguous to the silicide-silicon interface and deeper than the original peak of the implant profile. The resulting structure is found to provide a surface barrier connection of low threshold voltage together with low reverse leakage current.

In preferred embodiments of the invention, the contact metal is platinum and the implanted ions are either arsenic, antimony, or phosphorus.

BRIEF DESCRIPTION OF THE DRAWING

The invention will be better understood from the following more detailed description taken in conjunction with the accompanying drawing in which.

DETAILED DESCRIPTION

Figure 1:
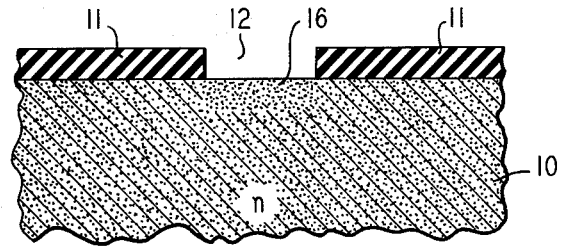
FIGS. 1 through 4 show in various stages of processing a semiconductive device to which a surface barrier connection is being made in accordance with an illustrative embodiment of the invention.

With reference now more specifically to the drawing, FIG. 1 shows in cross section a portion 10 of a larger silicon monocrystalline wafer, typically two or three inches in diameter and twenty mils thick, which may be homogeneous if there is to be formed a simple Schottky diode, or which may include a plurality of previously formed zones of different conductivity type to define a particular type of semiconductive device, such as a discrete junction transistor or a monolithic integrated circuit. Illustratively, the portion 10 is N-type with a relatively uniform background doping of about $1 \times 10^{16}$ phosphorous ions per cubic centimeter. Additionally, the portion 10 has been implanted with donor ions to form an implanted ion impurity profile which, for example, peaks between 300 angstroms and 400 angstroms below the surface with a peak concentration of at least ten times the background doping and typically between $1 \times 10^{18} - 5 \times 10^{18}$ ions per cubic centimeter and has a tail which falls off to an insignificant concentration beyond about 700 angstroms deep although extending in several thousand angstroms. Implantations of this kind can be readily achieved with conventional ion implantation equipment. Suitable profiles, for example, have been obtained with antimony as the implanted donor by use of accelerating voltages of 90 keV and dosages of between $6 \times 10^{12}$ and $9 \times 10^{12}$ ions/cm$^2$, with arsenic by use of an accelerating voltage of 70 keV and dosages of between $3 \times 10^{12}$ and $5 \times 10^{12}$ ions/cm$^2$, and with phosphorus by an accelerating voltage of 35 keV and dosages of $4 \times 10^{12}$ to $8 \times 10^{12}$ ions/cm$^2$. In practice, a wide range of accelerating voltages (for example 20 keV – 120 keV) of dosages (for example $1.0 \times 10^{12} - 2 \times 10^{13}$ ions/cm$^2$) may be used and the particular conditions chosen may be tailored to effect a desired compromise between threshold voltage and reverse leakage current. Typically, the larger the implanted dosage, the lower the forward turn-on voltage which can be achieved, though at the expense of higher leakage reverse currents.

Typically, the ion implantation is effectively localized to exposed portions of the wafer by a silicon oxide coating 11 which has been opened to provide a window 12 where the connection is eventually to be provided. Of course other techniques may be used to localize the implantation if this proves desirable. An exemplary window may be about 10 microns square, although the size is dependent on the nature of the device being made. After the ion implantation, the wafer is heated in the usual fashion to activate the implanted ions. In some instances, this step may be avoided, and instead the activation occurs incidentally during the subsequent heating of the wafer.

Before applying the contact metal, it has generally been found advantageous to clean the exposed surface where the surface barrier connection is to be made. This cleaning is to remove any surface oxide or contamination. Preferably the cleaning is done by putting the wafer into a sputtering system and ion etching or milling away a thin surface layer, typically one or two hundred angstroms thick. Alternatively in some instances, a chemical etching may be used if precautions are taken to avoid reformation of any appreciable oxide on the surface portion where the surface barrier connection is to be made.

Figure 2:
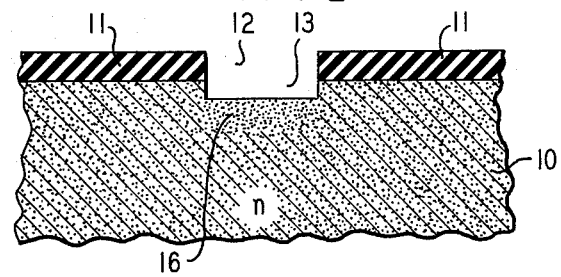

In FIG. 2, there is shown the wafer 10 after the cleaning step, whereby there is formed the depression 13 corresponding to the window 12 in the oxide 11.

A film of a suitable contact metal, preferably platinum, is then deposited on the clean surface, advantageously by sputtering in the same system as is used for the ion etching or milling to avoid the need for removal of the wafer and possibly exposing the wafer to an oxidizing atmosphere which might oxidize the clean surface. However, alternative techniques for the film deposition are feasible so long as there is avoided the formation of sufficient oxide to affect adversely the properties of the barrier.

Figure 3:
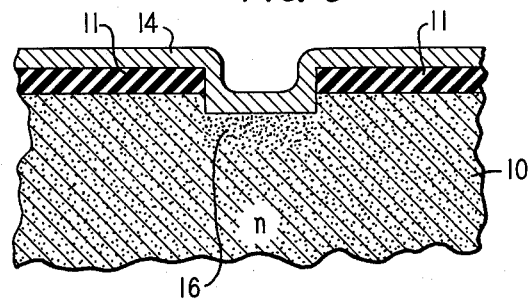

It is important that the thickness of the platinum film be made sufficiently thick that when the subsequent reaction with the silicon occurs, the interface between the platinum-silicide phase and the silicon proceeds well beyond the peak of the original implant profile. To this end, it is usually found advantageous to employ a thickness of at least several hundred angstroms for the platinum, and a thickness of 500 angstroms for the example being described has been found advantageous. The thickness should be greater than the depth of the peak in the profile of the implanted ions and preferably at least twice this depth. It is usually desirable to avoid a thickness of platinum in excess of 1000 angstroms to avoid excessive formation of silicide which might give rise to internal stress problems. After deposition of the platinum film, the wafer is removed from the sputtering system. FIG. 3 shows the wafer portion 10 after formation of the platinum film 14 which extends over the exposed surface of the wafer portion and the surrounding edge of the window in the oxide.

Next, the platinum film is reacted with the silicon where the two are in contact. Advantageously, the reaction is a solid-solid reaction to form a stoichiometric compound or silicide. To this end the wafer is heated in the range of between 400° C and 700° C for a time adequate to complete the reaction. In the example described, heating in a furnace at 650° C for about 10 minutes provided the desired reaction and resulted in penetration of the platinum-silicide interface to a depth of about 500 angstroms beyond the original platinum-silicon interface, corresponding to the formation of a platinum-silicide layer of about 1000 angstroms in overall thickness. This penetration of 500 angstroms is well beyond the depth of the peak of the original implant, about 100-200 angstroms below the original platinum-silicon interface. Moreover, it is found that the advancing platinum-silicide phase has collected and swept ahead of it in "snowplow" fashion most of the implanted ions, and presumably most of the background doping ions as well, whereby there is formed just ahead of the advancing interface a narrow accumulation region of increased dopant concentration. In particular, it is calculated that in the exemplary case there is formed, as a result of the snowplowing, a layer contiguous to the platinum-silicide interface having a thickness between 100 angstroms and 200 angstroms thick with an average doping concentration at least several times that at the peak of the implanted profile and at least $10^{19}$ ions per cubic centimeter. We believe this layer is narrower, more concentrated, and closer to the platinum-silicide interface than has been possible to actually realize by prior art techniques.

In addition, this narrow layer is achieved with relatively relaxed control of the process parameters, in particular the width and depth of the initial implantation because of the accumulation action of the advancing silicide. The resultant connection is found to permit lower reverse leakage currents for a given threshold voltage. Alternatively, there can be achieved a device having a lower threshold voltage for a given reverse leakage current. As still another alternative, use of our technique permits realization of barrier connections able to withstand higher reverse voltages before breakdown.

Figure 4:
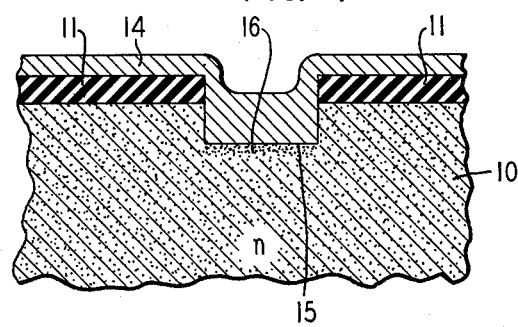

FIG. 4 shows the resultant structure in which the platinum-silicide interface 15 is shown penetrating deeper into the wafer and a consequent narrowing of the layer 16 in which the implanted ions are largely concentrated. Typically, there will be later provided another metallic layer over the silicide, which layer serves as the electrode to which a lead is bonded for making electrical connection to the wafer portion. This layer may be any of those known for contacting platinum-silicide.

By use of the technique described we have been able to reduce forward turn-on voltages from 410 millivolts to about 314 millivolts corresponding to a current of ten microamperes in a barrier of 630 $\mu^2$ area while maintaining the leakage current at 1 microampere for reverse voltages of 15.8 volts and at 10 microamperes for reverse voltages at 17.9 volts. By higher doping, we have obtained even lower turn-on voltages though at the expense of higher reverse currents.

It can be appreciated that various modifications can be made in the exemplary process described without departing from the spirit and scope of the invention.

First it should also be evident that the invention may be viewed broadly as a technique for concentrating into a narrow layer underlying a contact region a number of implanted ions which are more broadly distributed. To this end, it is only necessary that there be employed a contact material which forms a product with the underlying semiconductor having the desired property of accumulating encountered implanted ions.

It is believed that metals which form silicides with the silicon, such as palladium, nickel, titanium, tungsten, molybdenum, chromium and rhodium are particularly suitable. Alternatively, it may also prove feasible to utilize metals, which form alloys with the semiconductor, so long as the alloy phase has the desired accumulating property. This is realized if the segregation coefficient of the encountered ion is such that the ions prefer to move deeper into the semiconductor rather than being collected.

In particular, although the initial ion implantation was disclosed as passing through a window in an oxide layer before penetrating into the wafer, it will be appreciated that the implantation can be made through an oxide layer if this is found desirable, so long as the ion energy is adequate to pass through such layer and still penetrate adequately into the wafer. This technique may reduce the amount of surface damage and reduce the amount of silicon that needs to be removed before the contact metal is deposited. In some instances, it may be feasible to deposit the contact metal first and then implant through the deposited metal.

Additionally, while in the example the surface barrier connection is being made to N-type silicon, such a connection may also be made to P-type silicon. In this case, suitable acceptor ions would be implanted and a decrease in the threshold voltage would also result. It is also possible to implant ions of the opposite conductivity type into the substrate in such a manner as to produce an effective increase in the barrier height. This might be useful in special applications as where it is desired to have a difference in barrier heights between two separate contacts.

Figure 5:
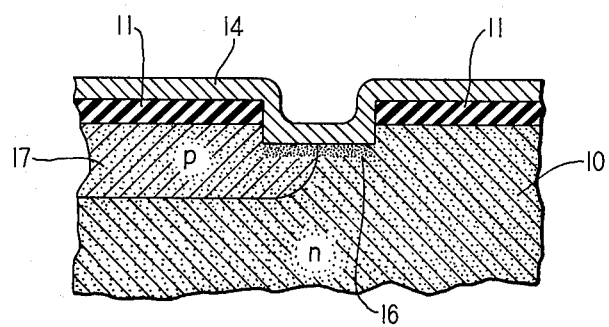
FIG. 5 shows a latter stage of processing of a semiconductor device to which a surface barrier connection to a region of one conductivity type is being made in the same processing stage as an ohmic connection to a region of another conductivity type in accordance with another illustrative embodiment of the invention.

In addition, the invention may be used in instances where a single connection is to contact adjacent N-type and P-type silicon surface zones, making a surface barrier connection to one and an ohmic connection to the other zone as shown in FIG. 5. In such an instance use of a nonselective donor implant into both zones 10 and 17 may be used to achieve a reduced threshold voltage associated with a surface barrier connection to one zone 10 without impairing the ohmic contact to the other 17. Alternatively, by localizing the implantation to underlie only part of a connection, there may be provided a connection with only one metal which has a part with a low barrier and another part with a higher barrier.

Figure 6:
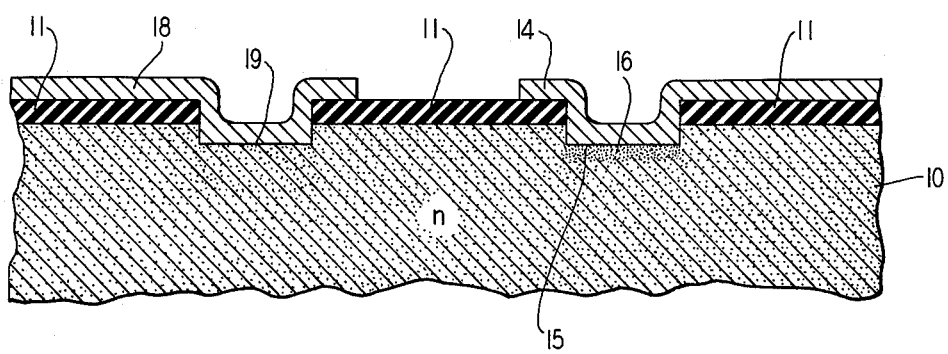
FIG. 6 shows a latter stage of processing of a semiconductor device to which separate surface barrier connections are being made to one region which has been implanted and to another region which has not been implanted in accordance with another illustrative embodiment of the invention.

Moreover, where they are desired, separate surface barrier connections of different barrier heights may be formed by selectively implanting the wafer surface as shown in FIG. 6. A separate layer of contact metal 18 overlies unimplanted wafer surface while contact metal 14 overlies implanted layer 16. Where the implanted layer 16 is of the same conductivity type as the bulk region 10, the contact 15 overlying the implanted region has a low surface barrier and the contact 19 overlying the unimplanted region has a higher surface barrier.

What is claimed is:

1. In the process of making a semiconductive device, the method of making a surface barrier connection to a silicon wafer which comprises the steps of implanting the region underlying where the connection is to be made with dopant ions of the conductivity type already predominant in the region, the implanted ions having a concentration profile with a peak lying below the silicon surface, depositing over said region a layer of the contact metal which is to make the connection to a thickness greater than the depth of the peak of the profile of the implanted dopant ions, and heating the wafer for causing the metal to react with the silicon, the resultant interface advancing into the wafer beyond the location of the original peak whereby the peak is moved deeper into the wafer and there is formed a layer of dopant ions of higher peak concentration than originally implanted and the connection is made beyond the original peak of the implanted profile.

2. The method of claim 1 further characterized in that before the deposit of the contact metal the peak in the profile of the implanted ions is at least several hundred angstrom units deep, and after heating the wafer for reacting the metal contact with the wafer the peak in the profile of the implant is less than a hundred angstrom units below the interface of the resultant with the silicon.

3. The method of claim 1 in which the contact metal reacts with the silicon to form a silicide.

4. The method of claim 3 in which the metal is platinum.

5. The method of claim 4 in which the region is N-type and the implanted ion is chosen from the group consisting of antimony, arsenic, and phosphorus.

6. The method of claim 4 in which the connection contacts both N-type and P-type material, forming a surface barrier connection with the former and an ohmic connection with the latter.

7. The method of claim 1 further characterized in that there is deposited a separate layer of the contact metal on the wafer surface where there has not been implantation whereby there results a contact having a low surface barrier overlying the implanted region and a contact having a higher surface barrier overlying the unimplanted region.

8. The method of claim 1 in which the implanted region includes portions of different conductivity types and in which the contact metal is used to make separate contacts to the portions of different conductivity whereby one contact is ohmic and the other contact is rectifying.

9. In the manufacturing of a silicon device, the process of making a platinum-silicide surface barrier connection to a silicon wafer comprising the steps of preparing a silicon wafer which has an N-type exposed surface portion where the connection is to be made, implanting the region underlying the surface portion with donor ions to provide a localized region of increased donor density having a peak concentration several hundred angstroms below the surface, cleaning said surface portion to remove any surface impurities, depositing over said surface portion before there is formed any appreciable surface oxide a layer of platinum whose thickness is greater than the depth of the concentration peak of the implanted donor ions, and heating the wafer to react the platinum film with the silicon wafer for forming a platinum-silicide layer which penetrates the wafer beyond the original concentration peak of the donor ions whereby the concentration peak is increased in amplitude and moved deeper into the wafer.

* * * * *